(12) United States Patent
Curran et al.

(10) Patent No.: US 10,170,650 B2
(45) Date of Patent: Jan. 1, 2019

(54) VERTICALLY STACKED PHOTOVOLTAIC AND THERMAL SOLAR CELL

(75) Inventors: Seamus Curran, Houston, TX (US); Sampath Dias, Houston, TX (US); Kang-Shyang Liao, Houston, TX (US); Soniya Devi Yambem, Houston, TX (US); Amrita Haldar, Houston, TX (US); Nigel Alley, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 535 days.

(21) Appl. No.: 12/975,038

(22) Filed: Dec. 21, 2010

(65) Prior Publication Data
US 2011/0146755 A1 Jun. 23, 2011

Related U.S. Application Data

(60) Provisional application No. 61/288,632, filed on Dec. 21, 2009.

(51) Int. Cl.
| | | |
|---|---|---|
| H01L 31/052 | (2014.01) | |
| H01L 31/032 | (2006.01) | |
| H01L 27/30 | (2006.01) | |
| H01L 31/055 | (2014.01) | |

(Continued)

(52) U.S. Cl.
CPC ........ *H01L 31/0322* (2013.01); *H01L 27/302* (2013.01); *H01L 31/043* (2014.12);
(Continued)

(58) Field of Classification Search
CPC ... H01L 25/042; H01L 25/043; H01L 25/045; H01L 27/302; H01L 31/052; H01L 31/0521
(Continued)

(56) References Cited

U.S. PATENT DOCUMENTS 4,082,570 A * 4/1978 House et al. ............... 136/246
4,140,142 A 2/1979 Dormidontov et al.
(Continued)

FOREIGN PATENT DOCUMENTS

| JP | 1995-066439 A | | 3/1995 |
| JP | 1999-214049 A | | 8/1999 |
| WO | WO-2007029750 | * | 3/2007 |

*Primary Examiner* — Edward J. Schmiedel
(74) *Attorney, Agent, or Firm* — Winstead PC

(57) ABSTRACT

According to some embodiments, the present invention provides a novel photovoltaic solar cell system from photovoltaic modules that are vertically arrayed in a stack format using thin film semiconductors selected from among organic and inorganic thin film semiconductors. The stack cells may be cells that are produced in a planar manner, then vertically oriented in an angular form, also termed herein tilted, to maximize the light capturing aspects. The use of a stack configuration system as described herein allows for the use of a variety of electrode materials, such as transparent materials or semitransparent metals. Light concentration can be achieved by using fresnel lens, parabolic mirrors or derivatives of such structures. The light capturing can be controlled by being reflected back and forth in the photovoltaic system until significant quantities of the resonant light is absorbed. Light that passes to the very end and can be reflected back through the device by beveling or capping the end of the device with a different refractive index material, or alternatively using a reflective surface. The contacting between stacked cells can be done in series or parallel. According to some embodiments, the present invention uses a concentrator architecture where the light is channeled into the cells that contain thermal fluid channels (using a transparent fluid such as water) to absorb and hence reduce the thermal energy generation.

5 Claims, 11 Drawing Sheets

(51) Int. Cl.
H01L 31/0749 (2012.01)
H01L 31/043 (2014.01)
H01L 31/054 (2014.01)
*H01L 51/42* (2006.01)

(52) U.S. Cl.
CPC ........ H01L 31/055 (2013.01); H01L 31/0521 (2013.01); H01L 31/0543 (2014.12); H01L 31/0749 (2013.01); *H01L 51/426* (2013.01); *H01L 51/4253* (2013.01); *Y02E 10/52* (2013.01); *Y02E 10/541* (2013.01)

(58) Field of Classification Search
USPC .............................................. 136/244; 3/244
See application file for complete search history.

(56) References Cited

U.S. PATENT DOCUMENTS

| | | | |
|---|---|---|---|
| 4,332,973 A * | 6/1982 | Sater ............................ | 136/246 |
| 4,638,111 A * | 1/1987 | Gay ............................... | 136/249 |
| 5,071,490 A * | 12/1991 | Yokota et al. ................ | 136/249 |
| 6,294,723 B2 | 9/2001 | Uematsu et al. | |
| 7,019,207 B2 | 3/2006 | Harneit et al. | |
| 2001/0029975 A1* | 10/2001 | Takeyama ........... | H01L 31/0508 136/244 |
| 2003/0047207 A1* | 3/2003 | Aylaian ......................... | 136/244 |
| 2004/0118451 A1* | 6/2004 | Walukiewicz et al. ........ | 136/262 |
| 2004/0211458 A1* | 10/2004 | Gui et al. ...................... | 136/244 |
| 2005/0051205 A1* | 3/2005 | Mook, Jr. ..................... | 136/255 |
| 2007/0034250 A1 | 2/2007 | Dutta | |
| 2007/0119497 A1 | 5/2007 | Umemoto et al. | |
| 2008/0115824 A1 | 5/2008 | Kang et al. | |
| 2008/0245408 A1* | 10/2008 | Ito ......................... | H01L 31/068 136/255 |
| 2008/0302357 A1* | 12/2008 | DeNault ....................... | 126/704 |
| 2009/0151787 A1* | 6/2009 | Yoshikawa ............. | B82Y 10/00 136/261 |
| 2009/0194160 A1 | 6/2009 | Chin et al. | |
| 2009/0211633 A1 | 8/2009 | Schilinsky et al. | |

\* cited by examiner

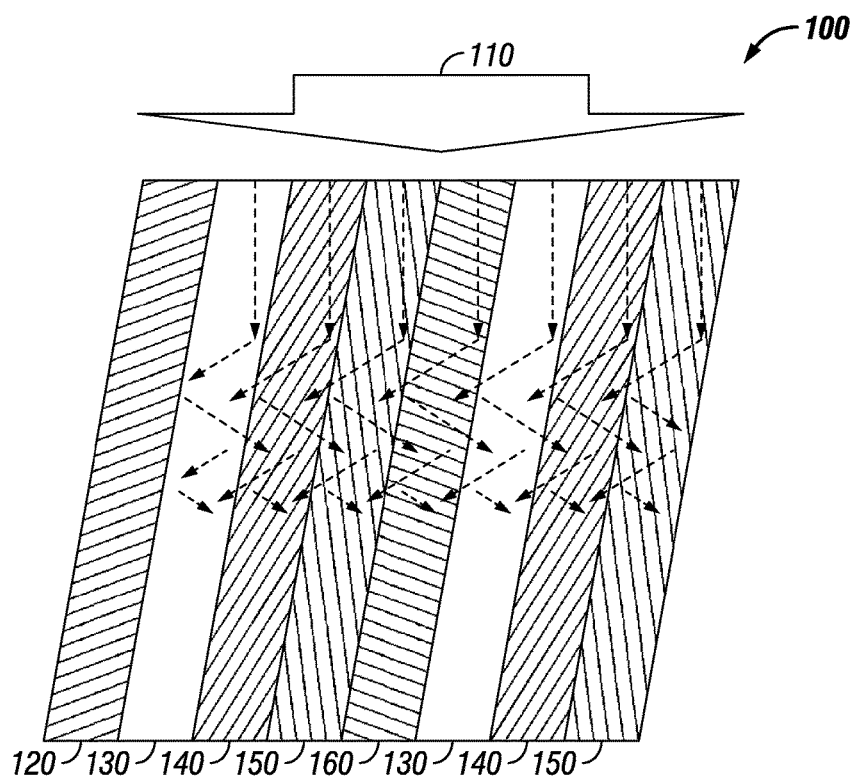
FIG. 1
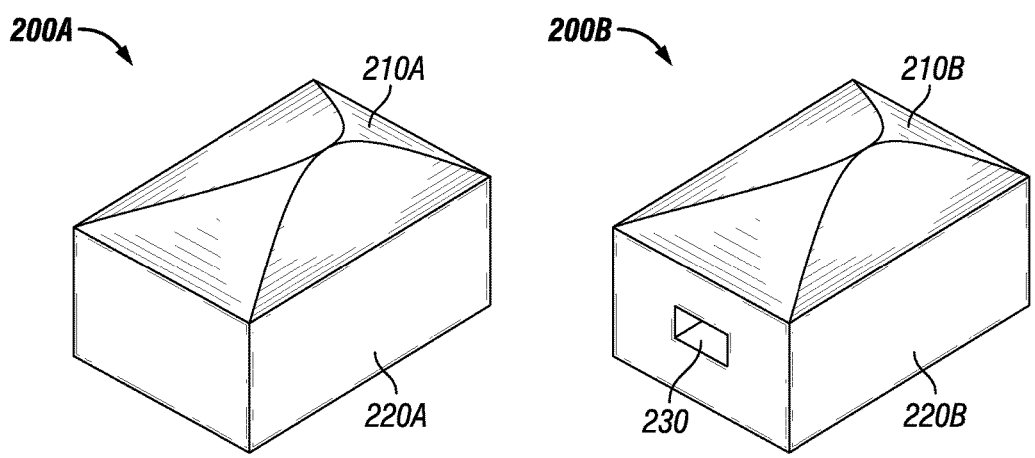
FIG. 2A  FIG. 2B

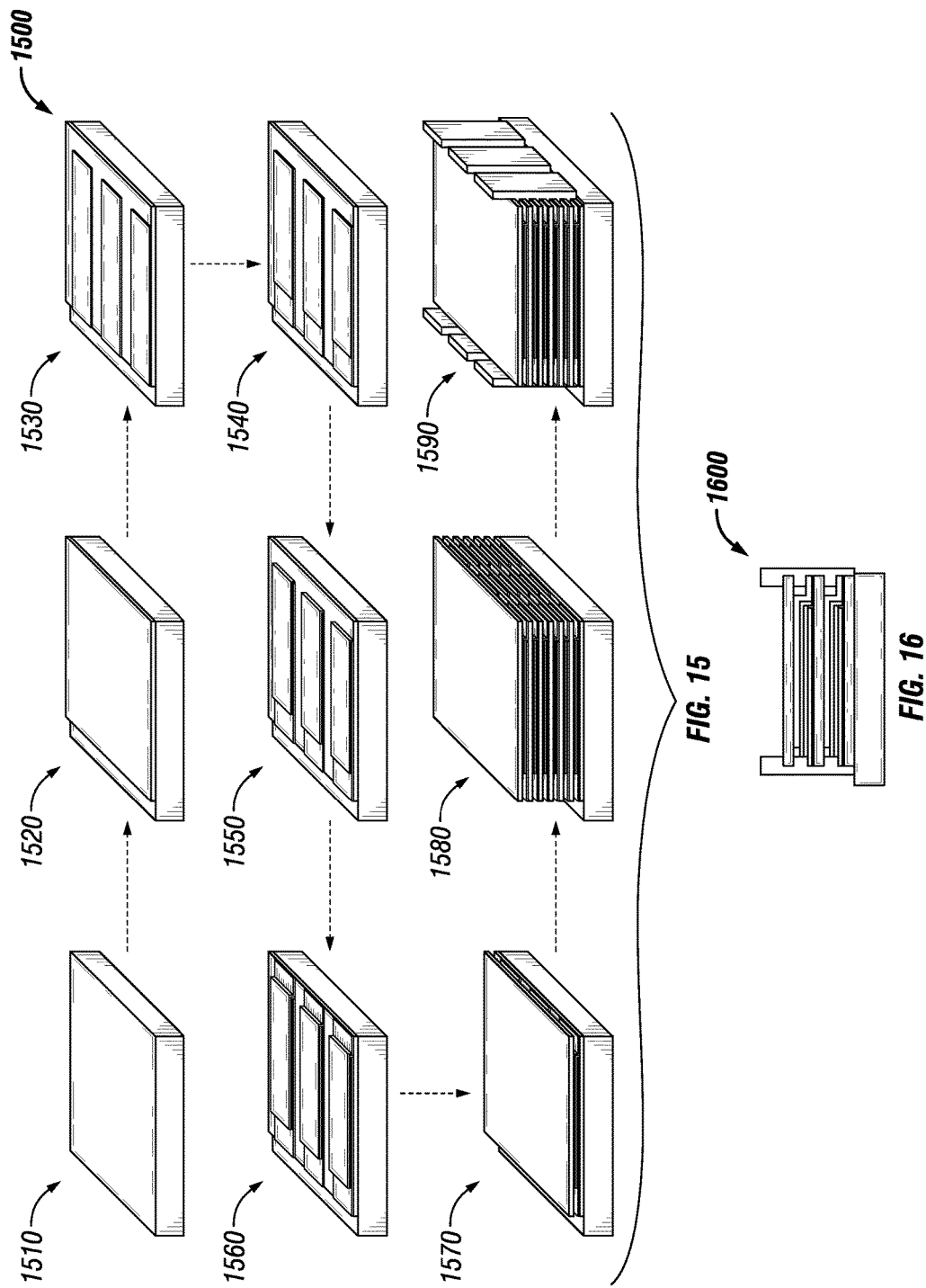

VERTICALLY STACKED PHOTOVOLTAIC AND THERMAL SOLAR CELL

CROSS-REFERENCES TO RELATED APPLICATIONS

This application claims priority to U.S. provisional application Ser. No. 61/288,632, entitled Vertically Stacked Photovoltaic and Thermal Solar Cell, filed Dec. 21, 2009, which is hereby incorporated herein by reference.

GOVERNMENTAL SPONSORSHIP

The U.S. Government has a paid-up license in this invention and the rights in limited circumstances to require the patent owners to license others on reasonable terms as provided for by the terms of grant No. DE-FG36-08G088008 awarded by the U.S. Department of Energy.

BACKGROUND OF THE INVENTION

The present invention relates to a new kind of photovoltaic (PV) solar cell system that combines concentrator techniques and coolant methods to maximize the electrical and thermal output from photovoltaic (PV) modules that are vertically arrayed in a stack format using thin film organic and/or inorganic semiconductors.

DESCRIPTION OF THE RELATED ART

There is currently an international effort to achieve higher performance from thin film devices including organic photovoltaic (OPV) devices and III-V semiconductor inorganic photovoltaic (IPV) such as but not limited to Copper Indium Gallium Selenide (CIGS). The goal is to produce modules that can produce electricity in an effective but cheap manner.

For inorganic photovoltaic (IPV) cells, to this day thin film solar cells made of III-V semiconductor compounds exhibit the leading energy conversion efficiencies. In 2008, a team at the National Renewable Energy Laboratory (NREL) achieved 19.9% efficiency in Copper Indium Gallium Selenide (CIGS) solar cells. Besides the potential for high efficiency, III-V semiconductor compound materials also have advantages including the bandgap tunability by elemental compositions, higher photon absorption by the direct bandgap energies and smaller thermal degradation than silicon solar cells. Prior art shows that efficiency improvement can be achieved by multistacking photovoltaic materials of different bandgap energies to form so-called multijunction or tandem cells. The idea of tandem cells is to absorb the photon energy from the sunlight spectrum more widely and efficiently by taking the advantage of the tunability of bandgap energies and lattice constants with the compositions of III-V semiconductor compounds. So far, the highest efficiency of about 40% has been achieved by triple-junction InGaP/GaAs/Ge cells developed independently by NREL, Boeing-Spectrolab and Fraunhofer.

Recent progress in making triple-junction InGaP/GaAs/Ge cells shows great promise toward the theoretical limit (50.1% efficiency at AM 1.5D, 1000 suns). However, the manufacturing of these cells is far away from trivial. For example, a series-connected monolithic triple-junction cell has more than 15 semiconductor layers. Each layer is deposited by epitaxial growth with metal-organic chemical vapor deposition (MOCVD), which tends to require precise lattice matching among these stacked semiconductor materials. Although efforts to develop next-generation manufacturing technology to produce 42% efficient III-V triple-junction tandem concentrator solar cells sponsored by NREL are currently underway, mass production of these cells will tend to require control of epitaxial growth by large area. Thus, technical challenges in making triple-junction InGaP/GaAs/Ge cells remain. Further, the cost of manufacturing these tandem cells may never reach a commercially feasible goal of 1$/Watt peak.

Recently, a collaborative team based on a Defense Advanced Research Projects Agency's (DARPA) program reported a novel cell module design with sunlight splitting by dichroic filters and located independently into cells with varied bandgap energies. In this architecture, each cell will receive a fraction of the solar spectrum absorbed most efficiently and converted into electrical power. This architecture avoids the current-matching issue among subcells and free carrier absorption loss in upper subcells for monolithic devices. They have independently tested three cells (two double-junctions and one single-junction) with proper filters to mimic spectral incidence to each cell and reported a 42.7% efficiency simply by summing up the efficiencies of the three cells. This shows that with proper optical design of the cell module, the design of each individual cell could be much simpler to manufacture without sacrificing the total efficiency.

For organic photovoltaic cells, much of this effort centers on the creation of polymer-nanoparticle blends which allow for efficient dissociation of photo-generated excitons. Device architectures based on these "bulk-heterojunction" blends have yielded beyond 5% conversion of incident light to electricity. They have primarily been based on polythiophene hosts dispersed with $C_{60}$ (fullerene) conjugates. The difficulty arises from the fact that different host materials, the available dispersant phase, or nanophase, of the blend may not have the appropriate electronic structure or form the right interface to support efficient resonant charge transfer. The additional factor of having a low absorption range which is then coupled to the reduced fill factor results in lower power conversion efficiency.

In a modular form, the limitations in standard device performance can include the effect of increased temperatures around the IPV or OPV, and increasing temperatures have a detrimental effect on the efficiency and longevity of the solar cells. A problem that is well-known for photovoltaic devices is the thermal degradation of the cell components due to temperature building caused by exposure to the sun. Over time, thermal degradation tends to affects the longevity of cells. Other issues also arise in collecting light in regions dominated by diffuse light or weather patterns that disperse direct sunlight into a diffuse format.

There remain fundamental issues with building successful photovoltaic cells that affect some or all thin film solar cells depending on the active media and even the use of electrodes and concentrators. These issues can include charge carrier transport since polymers, polymer composites and some inorganic thin films with crystalline defect limitations can convert some or all resonant light into charge carriers (electrons and holes or excitons), their carrier transport is poor. With respect to charge carrier transport, polymers, polymer composites and some inorganic thin films with crystalline defect limitations can convert some or all resonant light into charge carriers (electrons and holes or excitons), their carrier transport is poor. The reasons manifest themselves in organics since the exciton generated inside the polymer composite can only travel a very short distance, typically about 10 to 20 nm, before being recombined. Secondly, organic based photovoltaics possess poor mobilities and conductivities. Inorganic cells such as CdTe:CdSe suffer from defects occurring in the crystalline structures, causing imitations in the charge carrier transport. Consequently, polymer composite photovoltaic devices can only be made from ultra-thin semiconductor films (usually less than 150 nm). Ideally, if the light could be absorbed perfectly, a thin film of 20 nm would be enough, but this would be problematic when controlling pin-holing effects. The next issue in the challenge of dichotomy is transparency due to the necessity to have very thin films as a consequence of poor carrier transport properties, significant light is lost due to transparency. While getting the exciton out from the device may be solved, there is not sufficient material to prevent light from getting through. Finally, the issue is oxidation and water which can affect both organic and some inorganic based thin film devices that require stringently controlled laboratory conditions to minimize oxygen and water contamination in the polymers composites, which deteriorate device performance over time.

Further there are fundamental issues with electrode materials. In spite of their cost and limited instability over time, the use of transparent electrodes such as TO and ITO have been the dominant electrode materials in existing thin film devices. It is well-known that their performance are compromised if they are too thin (as their conductivity becomes poor) or too thick (as their transparency greatly diminishes).

SUMMARY

According to some embodiments, the present invention provides a novel photovoltaic solar cell system that combines concentrator techniques and coolant methods to maximize the electrical and thermal output from photovoltaic modules that are vertically arrayed in a stack format using thin film semiconductors selected from among organic and inorganic thin film semiconductors.

According to some embodiments, the purpose of this invention is to overcome efficiency and manufacturing limitations generally encountered in existing photovoltaic devices, may they be organic or inorganic solar cells. More specifically, according to some embodiments, the present invention addresses fundamental issues with building successful photovoltaic cells that affect some or all thin film solar cells depending on the active media and even the use of electrodes and concentrators.

Based on these principles, the stack cells as described according to some embodiments of the present invention are cells that are produced in a planar manner, then vertically oriented in an angular form, also termed herein tilted, to maximize the light capturing aspects.

The use of a stack configuration system as described herein allows for the use of a variety of electrode materials. In particular, the use of a stack configuration system as described herein allows for the use of a transparent electrodes, or semitransparent metals such as but not limited to Au, Ag (including silver paste). The light capturing can be controlled by being reflected back and forth until significant quantities of the resonant light is absorbed. Under such circumstances, immediate transparency is not needed as there is a length dimension involved that allows for the light to travel further enabling it to be absorbed. Light that passes to the very end and can be reflected back through the device by beveling or capping the end of the device with a different refractive index material, or alternatively using a reflective surface.

The devices described herein also addresses thermal degradation. According to some embodiments, the present invention addresses that issue by having thermal fluid inlets on the base substrate that collects and dissipates the heat away from the other cell components. This can also be achieved using the concentrator architecture where the light is channeled into the cells that contain thermal fluid channels (using a transparent fluid such as water) to absorb and hence reduce the thermal energy generation. The light concentration can be achieved by using fresnel lens, parabolic mirrors or derivatives of such structures. Use of concentrator solar cells and lensing mechanisms such as but not limited to Fresnel lens addresses the issue of collecting light in regions dominated by diffuse light or weather patterns that disperse direct sunlight into a diffuse format. The contacting between stacked cells can be done in series or parallel.

BRIEF DESCRIPTION OF THE FIGURES

FIG. 1 illustrates a vertical multiple stack photovoltaic device;

FIG. 2A illustrates a basic lensing system;

FIG. 2B illustrates a basic lensing system with thermal parts;

FIG. 15 illustrates a process for fabricating OPV stacked tandem cells;

FIG. 16 illustrates a side view of OPV stacked tandem cells made by the process of FIG. 15;

DESCRIPTION OF THE PREFERRED EMBODIMENTS

Figure 3:
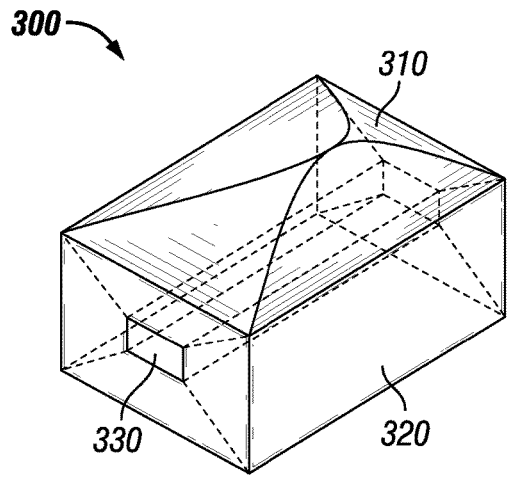
FIG. 3 illustrates a complex lensing system.

In various embodiments, stack photovoltaic devices are described herein. The stack photovoltaic devices include a flat substrate, a first electrode layer coating the planar substrate, a continuous semiconductive (active material—AM) layer deposited above the first electrode layer, and a second electrode layer deposited above the continuous AM layer. The first electrode layer is at least partially transparent to electromagnetic radiation. The continuous AM layer is in electrical contact with the first electrode layer. The second electrode layer is in electrical contact with the continuous AM layer. The continuous AM layer absorbs electromagnetic radiation and turns the electromagnetic radiation into electrical power (voltage and current generated). The continuous AM layer includes at least one semiconducting material, but more generally two in the form of a heterojunction layer, but those continuous lines of different active materials are laid down in series. The devices (as shown in FIG. 1), when formed are then combined with other planar structures in a series of stacks where the devices are mounted vertically rather than planar to the incident light. In this way, the light is channeled downwards through the different layers until the resonant light has been absorbed and turned into electrical power.

FIG. 1 illustrates vertical multiple stack photovoltaic device 100, showing light input 110, fully-reflective Al 120, thin Film organic semi-conductor (OSC 130), semi-reflective Au 140, substrate 150, and semi-reflective Al 160. FIG. 1 depicts an example of semitransparent path system designed for the vertically stacked tandem organic photovoltaic (OPV) cells.

The substrate slides are made up of but are not limited to amorphous silicon glass, quartz glass, doped glass that contain fluorescent nano or micro particles, also/or contain anti-stokes particles. Alternatively, the substrate can be made up of polymers, that can also contain anti-stokes with embedded dyes/molecules to shift the absorbed light from infra-red light to visible light, or UV fluorescent dyes that can convert UV light to the visible or near IR.

The initial semiconductor layer generally contains a host p-type polymer (polythiophene, polycarbazole, polybenzothiadiazole, including their copolymers) and an n-type semiconductor such as but not limited to PCBM ($C_{60}$ or $C_{70}$ version) or perylene diimide derivatives. The second layer can contain another polymer (p- or n-type) and a quantum dot or quantum rod (such as, but not limited to, low bandgap nanoparticles such as $Cu_2S$, CdS, CdSe, PbS or PbSe) that absorbs another part of the solar spectrum. The third layer contains another polymer (p- or n-type) and a quantum dot or quantum rod that absorbs another part of the solar spectrum. The purpose of each additional layer is to absorb more of the solar spectrum that other layers fail to absorb.

The purpose of using metal layers as another option of providing a 'high work function' electrode is to replace transparent electrode Indium Tin Oxide (ITO). Elements such as Au, Ag, Co, Ni, Pt, Pd and Mo are examples of high work function metals that may be used as electrodes. However, these electrodes must by definition and need to be semi-transparent. This transparency must range from 10%-70% transparent. The counter electrode such as Al may be semi-transparent or fully reflective.

A lensing system (as shown in FIGS. 2A and 2B) may also be used to increase the intensity of light and/or to take in diffuse or low intensity light. The lenses may comprise of a convex lens, a Fresnel lens, or optical combinations to increase the intensity of light striking the PV device and/or deflect more incident light (diffuse or direct light).

FIG. 2A illustrates lensing system 200A, showing lens 210A, and carrier Case 220A. FIG. 2A depicts a basic lensing design where lens 210A, which may be a Fresnel lens, sits on top of carrier case 210B which contains a concentrator.

FIG. 2B illustrates lensing system 200B with thermal parts, showing lens 210B, carrier Case 200B, and thermal fluid coolant exit 230. FIG. 2B depicts a basic lensing design where lens 210B, which may be a Fresnel lens, sits on top of carrier case 210B which contains a concentrator and thermal parts.

Alternatively, a new lensing system that may be used is the bell lens system which is used to deflect direct or diffuse light into the device. As shown in FIG. 3, the system consists of a Fresnel lens that focuses light through the lensing system onto a concave lens which then broadens out the light to strike more of the devices. It also reduces the lensing action to prevent highly intense light striking the semiconductor layer, which can have the effect of degrading the active layer and so reduces the effectiveness of the lensing action.

FIG. 3 illustrates complex lensing system 300, showing Fresnel lens 310, carrier case 320, and central coolant channel 330. FIG. 3 depicts an example of a complex lens design with Fresnel lens 310 on top that focuses light through the lensing system onto a concave lens which then broadens out the light to strike more of the photovoltaic (PV) devices and central coolant channel 330.

The stacks are mechanically connected together through a press action (FIG. 4). The stacks are glued together where the glue is a thin film.

Figure 4A:
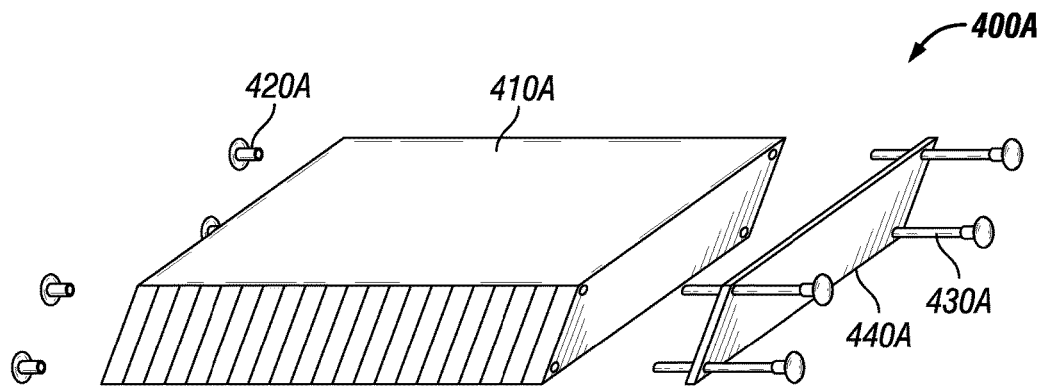
FIG. 4A illustrates a rod and plate press system.

FIG. 4A illustrates rod and plate press system 400A, showing stack formation 410A, fastener 420A, rod 430A, and plate 440A. FIG. 4A depicts an example of slides in stack formation 410A where they are physically bound, but not limited to these methods, by a mechanical press system.

Figure 4B:
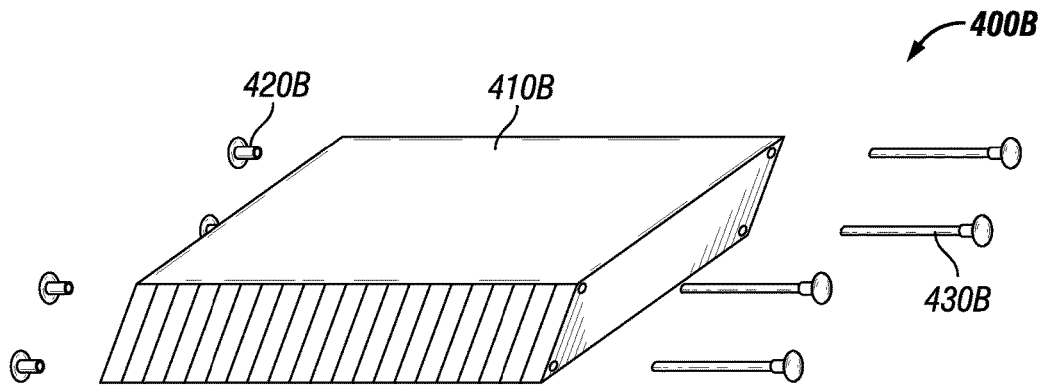
FIG. 4B illustrates a rod and bolt press system.

FIG. 4B illustrates rod and bolt press system 400B, stack formation 410B, fastener 420B, and rod 430B. FIG. 4B depicts another example of slides in stack formation 410B where they are physically bound, but not limited to these methods, by a mechanical press system.

Figure 5:
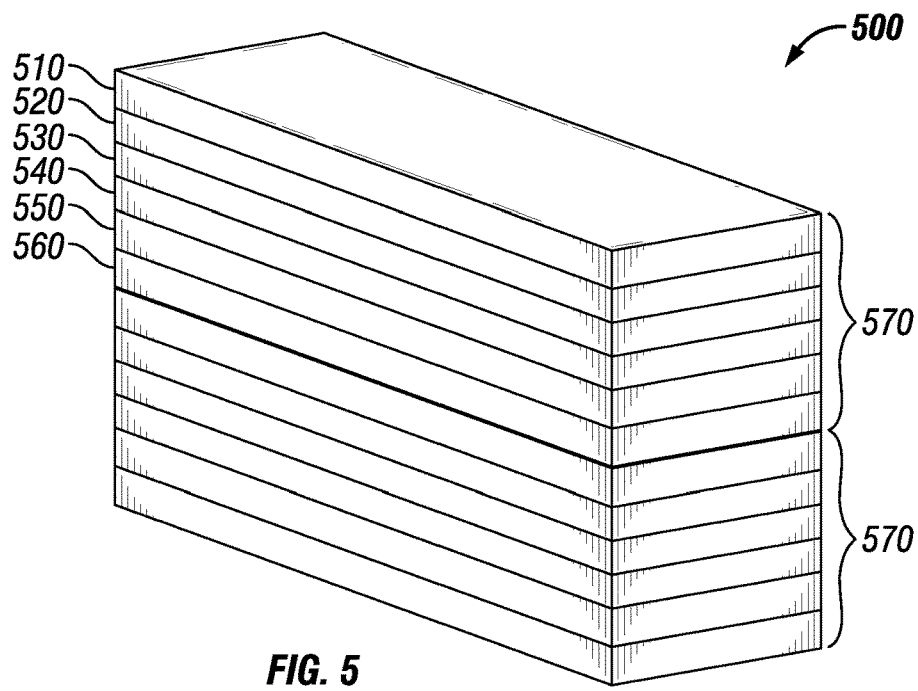
FIG. 5 illustrates an organic photovoltaic (OPV) cell design.

FIG. 5 illustrates an organic photovoltaic (OPV) cell design 500, showing substrate 510, ITO 520, PEDOT:PSS 530, OSC 540, LiF 550, Al 560, and organic photovoltaic cell 570. FIG. 5 depicts a standard organic photovoltaic (OPV) cell design, vertically oriented and tilted. The design shown in FIG. 5 is contemplated for use without thermal channels.

Figure 6:
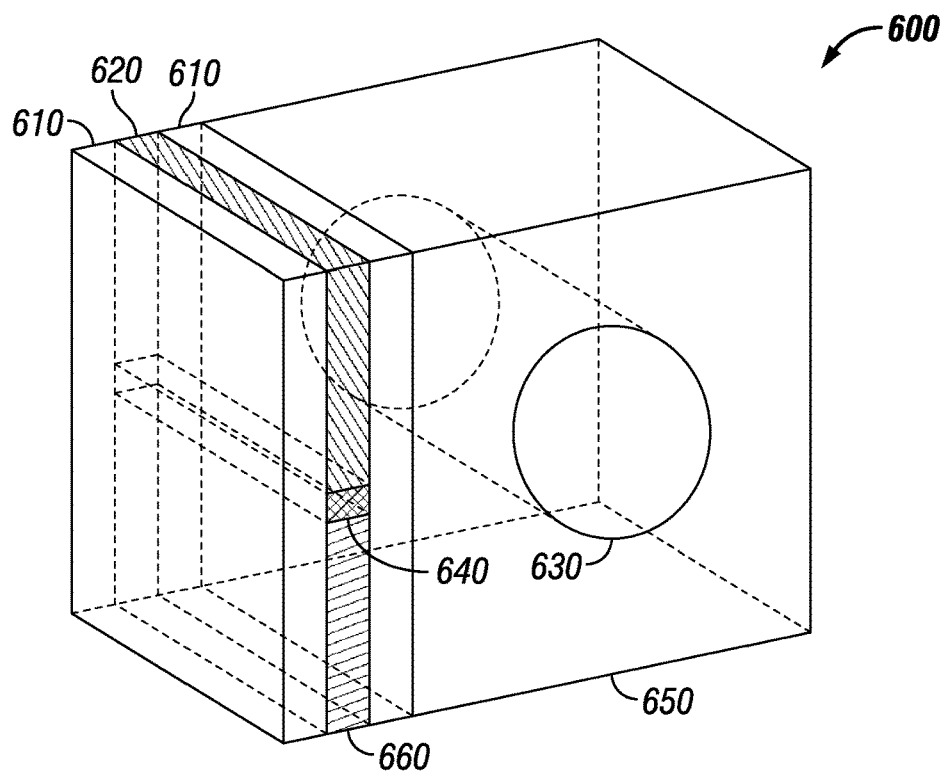
FIG. 6 illustrates an OPV cell design with thermal channels.

FIG. 6 illustrates OPV cell design 600 with thermal channels, showing electrodes 610, first organic active layer 620, thermal channel 630, spacer 640, substrate 650, and second organic active layer 660. FIG. 6 depicts tandem organic photovoltaic (OPV) cell design 600 with thermal channel 630, incorporating 1) electrodes 610, where one electrode is a high work function metal and the second electrode is a low work function material, allowing a Schottky formation, 2) first organic active layer 620, 3) thermal channel 630, which may be a the tube flow to take away the heat, 4) spacer 640 between two different active layers 620 and 640, 5) substrate 650, and 6) second organic active layer 660.

Figure 7:
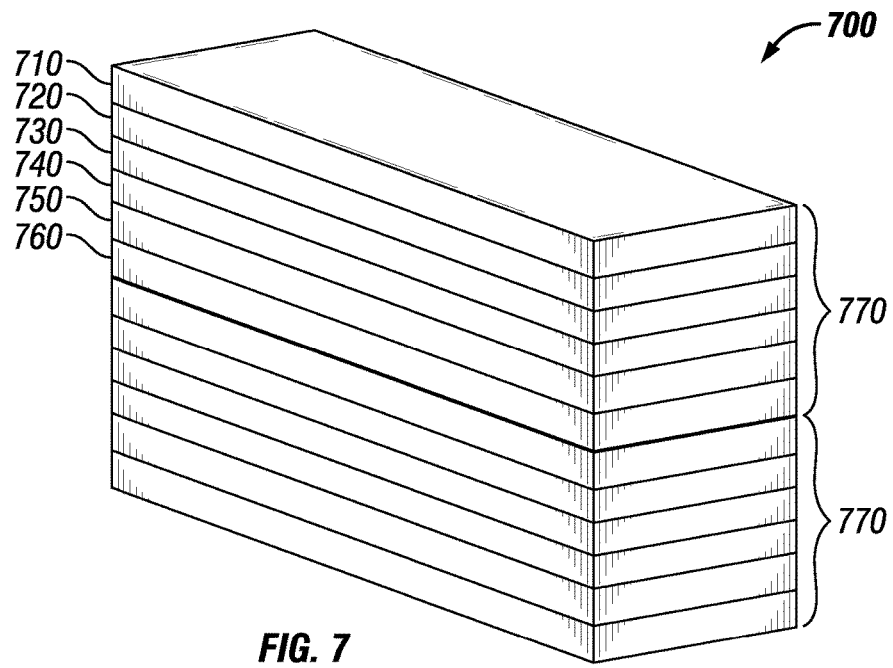
FIG. 7 illustrates an inorganic photovoltaic (IPV) cell design.

FIG. 7 illustrates inorganic photovoltaic (IPV) cell design 700, showing substrate 710, Mo 720, $Cu(InGa)Se_2$ 730, CdS 740, ZnO 750, ZnO:A 760, and inorganic photovoltaic cell 770. FIG. 7 depicts inorganic photovoltaic (IPV) stacked cell 770 linearly aligned at an angle for optimum absorption. While not shown here, a semitransparent electrode can also in part be used such as Au or Ag. The design shown in FIG. 7 is contemplated for use without thermal channels.

Figure 8:
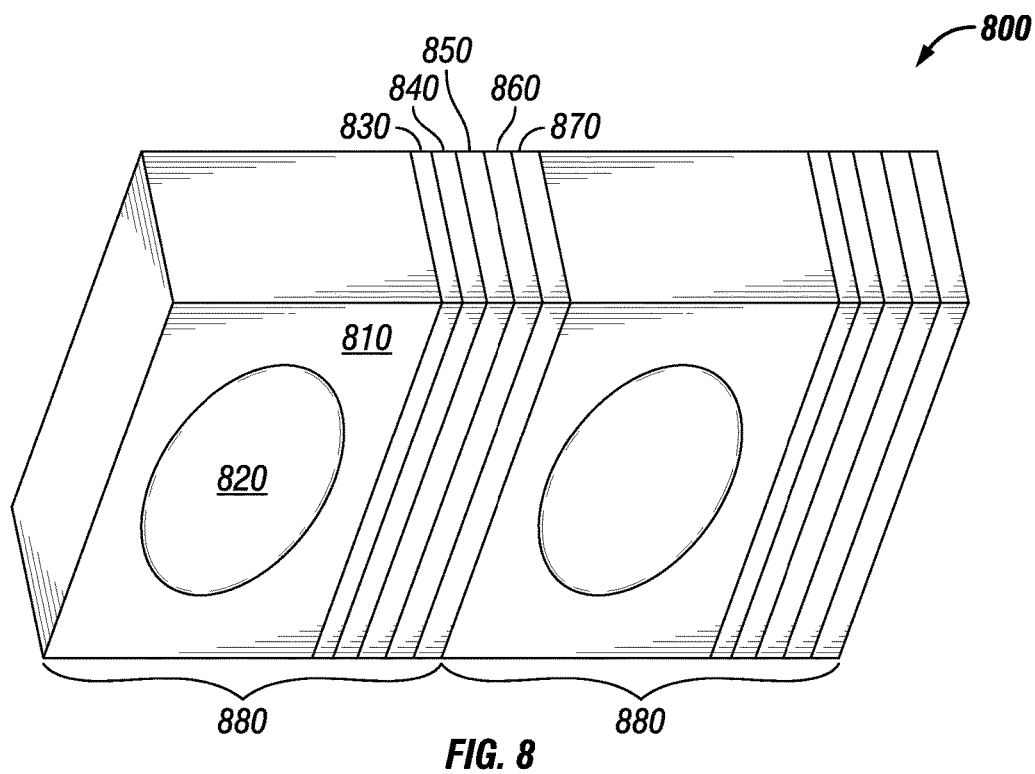
FIG. 8 illustrates an IPV cell design with the thermal channels.

FIG. 8 illustrates IPV cell design 800 with thermal channels, showing substrate 810, Thermal Channel 820, Mo 830, Cu(InGa)Se$_2$ 840, CdS 850, ZnO 860, ZnO:Al 870, and inorganic photovoltaic cell 880. FIG. 8 depicts a simple Copper Indium Gallium Selenide (CIGS) example of inorganic photovoltaic (IPV) cells 880 with thermal channels 820.

Figure 9:
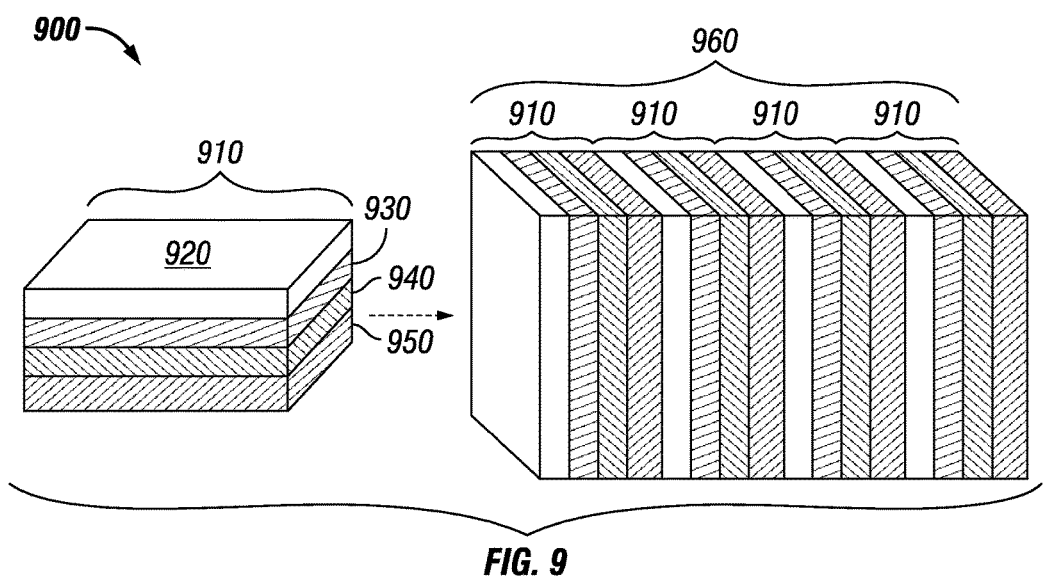
FIG. 9 illustrates a complex cell design.

FIG. 9 illustrates complex cell design formation process 900, showing cell 910, metal electrode 920, semiconductor active layer 930, metal electrode 940, substrate layer 950, and complex cell design 960. Metal electrodes 920 and 940 have different workfunctions, except when the active layer is a pn junction. Within the process, shown by the arrow, of forming complex cell design 960 from cells 910, cell 910 is tilted vertically so that complex design 960 is oriented vertically. FIG. 9 depicts typical cells 910 fabricated in a planar manner where metal electrode 920 is the top electrode, semiconductor active layer 930 is the active photovoltaic (PV) layer, metal electrode 940 is the bottom electrode and substrate layer 950 is the substrate. For organic photovoltaic (OPV) cells the electrodes have different work functions. For example, Au, AG Pt are examples of high workfunction metals and Al, Ca, Mg are examples of low workfunction metals. Further, alloys may be also used providing the work function factors are maintained. For inorganic photovoltaic (IPV) cells, the metal electrodes may be of the same work function, depending on whether Schottky or p-n type cells are formed. The design shown in FIG. 9 is contemplated for use without thermal channels.

Figure 10:
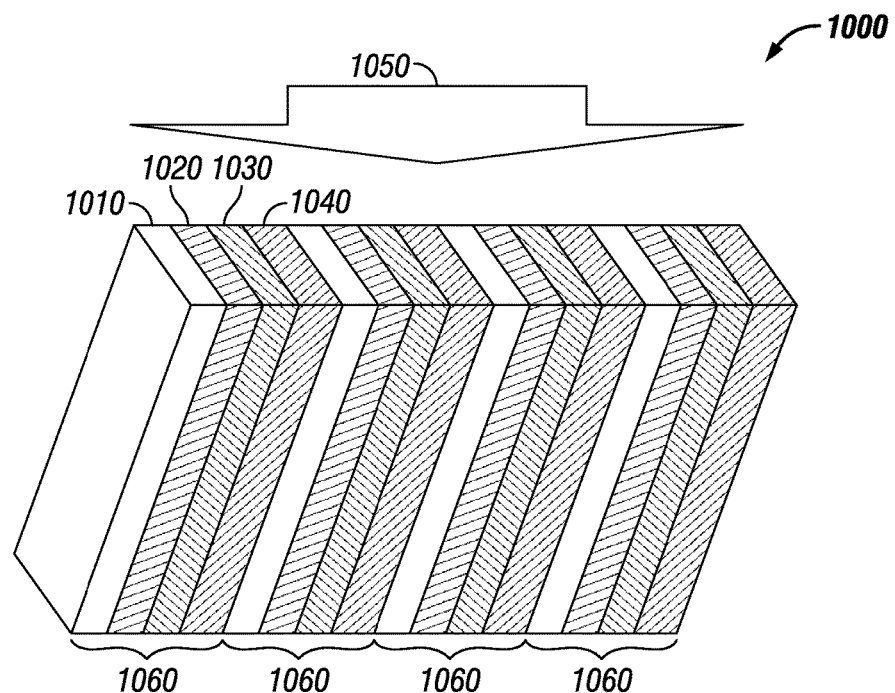
FIG. 10 illustrates a type of tilted complex cell design.

FIG. 10 illustrates a tilted complex cell design 1000, showing metal electrode 1010, semiconductor active layer 1020, metal electrode 1030, substrate layer 1040, light input from the top 1050, and stack 1060. More particularly, FIG. 10 depicts stacks 1060 tilted so that the light comes in and is then reflected through the different layers to get to active photovoltaic (PV) layer 1040. The design shown in FIG. 10 is contemplated for use without thermal channels.

Figure 11:
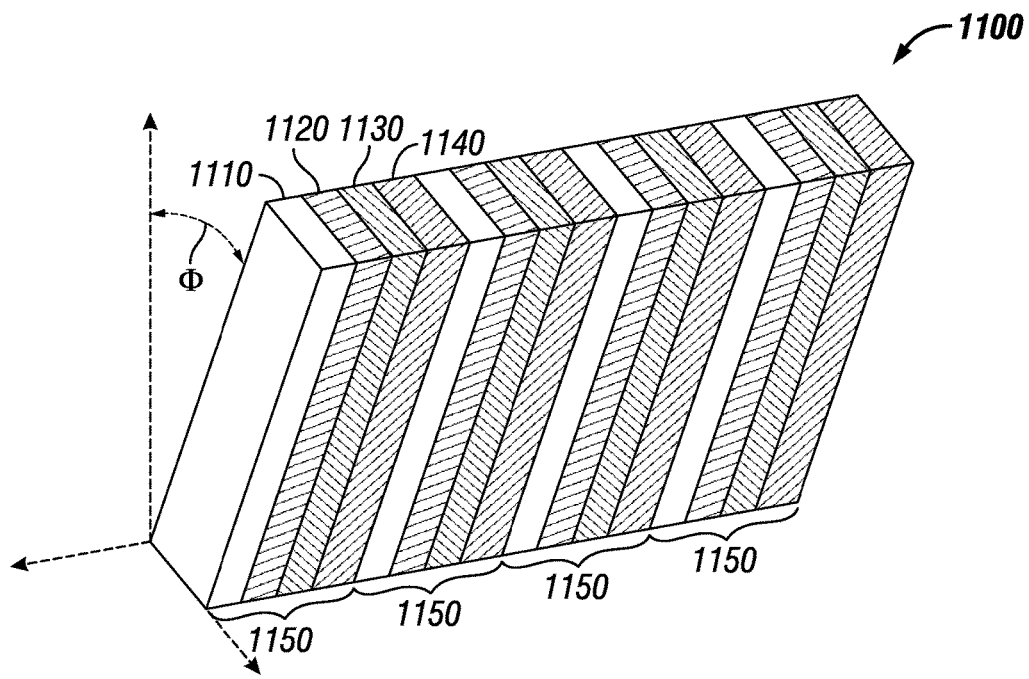
FIG. 11 illustrates another type of tilted complex cell design.

FIG. 11 illustrates another tilted complex cell design 1100, metal electrode 1110, semiconductor active layer 1120, metal electrode 1130, substrate layer 1140, and stack 1150. Devices are tilted to allow for optimum light input and capture. FIG. 11 depicts a design in which metal electrode 1110 is the top electrode, semiconductor active layer 1120 is the active photovoltaic (PV) layer, metal electrode 1130 is the bottom electrode and substrate layer 1140 is the substrate and they 1100, 1120, 1130, and 1140 are all vertically stacked perpendicular to the plane but tilted at an angle cp, where the angular dependence is determined by the refractive index of the active SC layer and/or light management. The design shown in FIG. 11 is contemplated for use without thermal channels.

Figure 12:
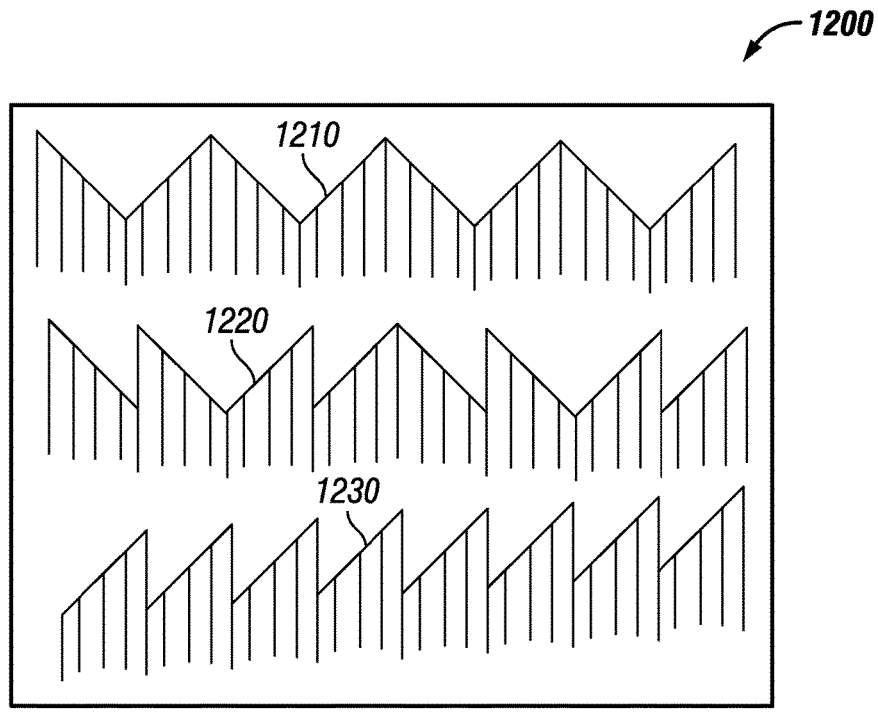
FIG. 12 illustrates yet another type of tilted complex cell design.

FIG. 12 illustrates yet another tilted complex cell design 1200, first cell top tilting 1210, second cell top tilting 1220, and third cell top tilting 1230. The tops of the cells exposed to light are tilted to capture light in an optimum manner. FIG. 12 depicts exemplary arrangements 1210, 1220, and 1230, illustrating that the stacks can be arranged in a number of different ways. FIG. 12 shows the stacks prior to the tilting depending on whether a lens system is used). The design shown in FIG. 12 is contemplated for use without thermal channels.

Figure 13:
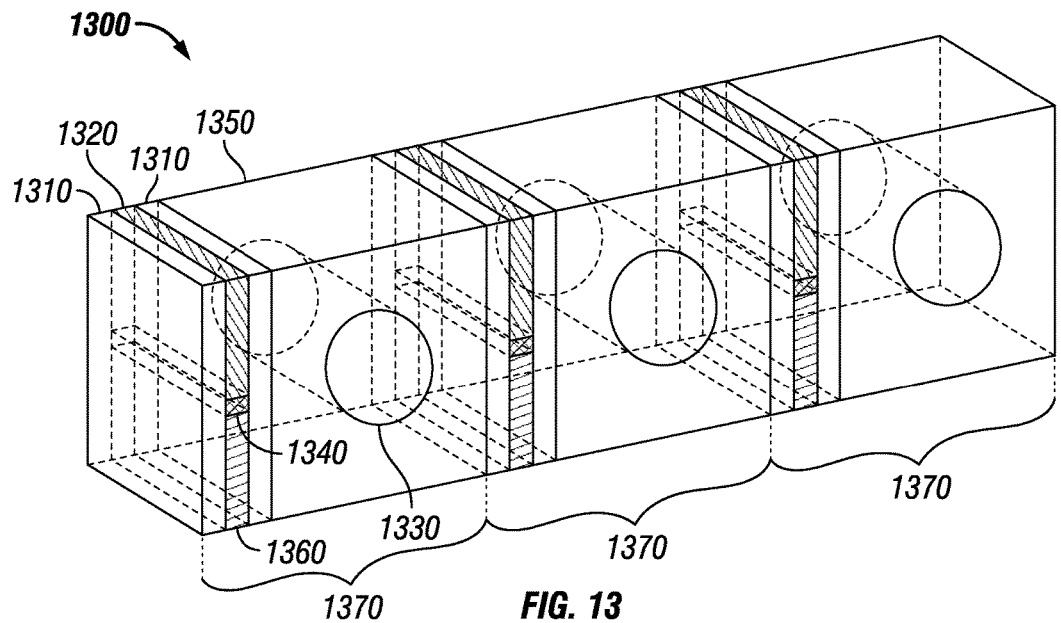
FIG. 13 illustrates a complex cell design with thermal channels.

FIG. 13 illustrates a complex cell design 1300 with thermal channels, electrodes 1310, first organic active layer 1320, thermal channel 1330, spacer 1340, substrate 1350, second organic active layer 1360, and photovoltaic cell 1370. FIG. 13 depicts tandem design 1300 with multiple organic photovoltaic (OPV) cells 1370 and thermal channels 1330 (shown non-tilted for diagrammatic reasons).

Figure 14:
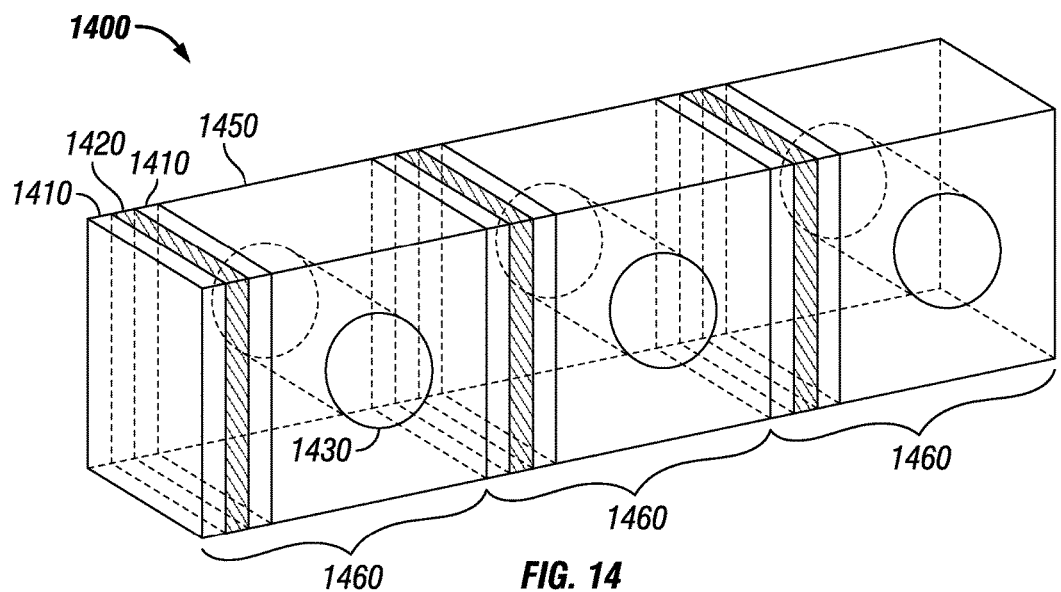
FIG. 14 illustrates another complex cell design with thermal channels.

FIG. 14 illustrates another complex cell design 1400 with thermal channels, showing electrodes 1410, organic active layer 1420, thermal channel 1430, substrate 1450, and photovoltaic cell 1460. FIG. 14 depicts tandem design 1400 with multiple Inorganic photovoltaic (IPV) cells 1460 and thermal channels 1430 (shown non-tilted for diagrammatic reasons).

Processes for Fabrication of Inorganic Photovoltaic (IPV) Stacked Tandem Cells:

Processes for fabrication of IPV stacked tandem cells typically involve seven steps.

Step 1. Base

A base is used as the foundation for the fabrication process. The dimensions of the base typically range from mm$^2$ to m$^2$, which depends on the limitation of manufacturing deposition techniques used. The material for the base can be, but is not limited to glass, sheet metal or a plastic sheet. The base acts as a structure support for the final stack cells. It can also be peeled away to allow the final stack cells to be free standing.

Step 2. Substrate Deposition

A transparent substrate is deposited on top of the base. The dimensions of the substrate range from mm$^2$ to m$^2$ and the thickness of the substrate typically ranges from a few μm to mm, which depends on the limitation of deposition techniques used. The material for the substrate can be inorganic such as but is not limited to a thin sheet of amorphous silicon glass, quartz glass, doped glass or metal oxide. The deposition of the inorganic substrate is achieved with commonly used deposition techniques for inorganics such as evaporation, sputtering and atomic layer deposition. Functional dopants can also be added to the substrate for special needs. For example, anti-stokes (IR fluorescent) pigments can be used as dopants in the substrate. The pigments are excited by IR energy, and emit in the visible region at a shorter wavelength at which the photoactive polymer layer usually absorbs. Alternatively, UV fluorescent dyes can also be used to convert UV light to the visible or near IR. Inorganic/organic particles (SiO$_2$ and metal oxide nanoparticles), fibers (metal oxides nano-fibers and carbon nanotubes) and platelets (clay) can be used for encapsulation, structure reinforcements or as fire retardants.

Step 3. Bottom Contact Deposition

A bottom contact is deposited on top of the substrate. The dimensions of the bottom contact typically range from a few mm$^2$ to m$^2$ and the thickness of the contact typically ranges from a few to several hundred nm. A high work function metal (such as, but not limited to Au, Ag, Co, Ni, Pt, Pd or Mo) can be deposited by evaporation or sputtering. A semitransparent layer is preferred, although it may not be required for certain architectures.

Step 4. III-V Semiconductor Light Absorber Deposition

A III-V semiconductor light absorber such as but not limited to CIGS is deposited on top of the bottom contact. The dimensions of the absorber layer typically ranges from a few mm$^2$ to m$^2$ and the thickness of the layer typically ranges from a few to several μm. An epitaxial growth vapor deposition process is preferred in order to reach high efficiency of the resulting IPV. The bandgap of semiconductor layer is tuned by changing the feeding rate of each element during the growth process.

Step 5. Buffer Layer Deposition

A buffer layer such as but not limited to CdS is deposited on top of the absorber layer. The dimensions of the buffer layer typically ranges from $mm^2$ to $m^2$ and the thickness of the layer typically ranges from a few to several hundred nm. The buffer layer is grown on top of the absorber layer by chemical-bath deposition (CBD) in order to achieve preferred lattice structures to reduce the charge recombination in the space-charge region. Alternatively, CdS precursor nanoparticles can be deposited by "wet" method (spin coating, spray coating, dip coating, doctor blading, inkjet printing and screen printing) followed by in-situ sintering to form the final buffer layer.

Step 6. Window Layer Deposition

A window layer such as but not limited to ZnO is deposited on top of the buffer layer. The dimensions of the window layer typically range from a few $mm^2$ to $m^2$ and the thickness of the layer typically ranges from a few to several hundred nm. A bilayer growth of insulating ZnO and conductive $Al_2O_3$-doped ZnO by RF sputtering is preferred in order to enhance the effective diffusion length of minority carriers (electrons). Deposition of ZnO and $Al_2O_3$-doped ZnO precursor nanoparticles by "wet" method (spin coating, spray coating, dip coating, doctor blading, inkjet printing and screen printing) followed by sintering in-situ can be an alternative.

Step 7. Top Contact Deposition

A top contact is deposited on top of the window layer. The dimensions of the top contact typically range from a few $mm^2$ to $m^2$ and the thickness of the contact typically ranges from a few to several hundred nm. A low work function metal (Al, Ca or Mg) or metal alloy is deposited by evaporation or sputtering.

Step 8. Repeat Steps 2-7

To fabricate the final IPV stacked cells, repeat step 2 to 7 multiple times to reach the desired stacking size.

Processes for Fabrication of Organic Photovoltaic Stacked Tandem Cells:

Processes for the fabrication of organic PV stacked tandem cells are designed to adopt existing technologies used in the manufacture of organic PV cell. The whole fabrication process of the present invention involves six steps as shown in FIG. 15.

FIG. 15 illustrates fabrication process 1500, showing base 1510, first intermediate 1520 formed from base 1510 by a first step involving substrate deposition (10 μm plastic), second intermediate 1530 formed from first intermediate 1520 by a second step involving bottom contact deposition (100 nm Au), third intermediate 1540 formed from second intermediate 1530 by a third step involving carrier layer deposition (50 nm PEDOT:PSS), fourth intermediate 1550 formed from third intermediate by a fourth step involving active polymer layer deposition (active layer A, B, C), fifth intermediate 1560 formed from fourth intermediate 1550 by a fifth step involving top contact deposition (100 nm Al), sixth intermediate 1570, formed by a sixth step involving substrate deposition (10 μm plastic), seventh intermediate 1580 formed from sixth intermediate 1570 by a seventh step involving repeating steps 2-6, that is the second through sixth steps, and organic photovoltaic cell 1590 formed from seventh intermediate 1580 by a step involving adding anode and cathode connections. FIG. 15 depicts a process for fabrication of organic photovoltaic (OPV) stacked tandem cells 1590.

FIG. 16 illustrates a side view 1600 of the organic PV stacked tandem cells 1590 fabricated in the process of FIG. 15.

Step 1. Base

A base is used as the foundation for the fabrication process. The dimensions of the base typically range from a few $mm^2$ to $m^2$, which depends on the limitation of deposition techniques used in the fabrication process. The material for the base is but not limited to glass, sheet metal or a plastic sheet. The base acts as a structure support for the final stack cells. Alternatively it is also be peeled away to allow the final stack cells to be free standing.

Step 2. Substrate Deposition

A transparent substrate is deposited on top of the base. The dimensions of the substrate typically range from a few $mm^2$ to $m^2$ and the thickness of the substrate typically ranges from a few μm to mm, which depends on the limitation of deposition techniques used. The material for the substrate can be inorganic such as but not limited to thin sheet of amorphous silicon glass, quartz glass, doped glass or metal oxide. The deposition of the inorganic substrate is achieved with commonly used deposition techniques for inorganics such as evaporation, sputtering and atomic layer deposition. Alternatively, organic materials can also be used for the substrate, such as, but not limited to vinyl polymers, polyesters, polyimides, polyurethanes, polyureas, cellulose and epoxy. The deposition of the organic substrate is achieved with common polymer commonly used deposition techniques such as spin coating, spray coating, dip coating, doctor blading, inkjet printing, screen printing and evaporation.

In addition, functional dopants can be added to the substrate for special needs. For example, anti-stokes (IR fluorescent) pigments can be used as dopants in the substrate. The pigments are excited by IR energy, and emit in the visible region at a shorter wavelength at which the photoactive polymer layer usually absorbs. Alternatively, UV fluorescent dyes can also be used to convert UV light to the visible or near IR. Inorganic/organic particles (such as $SiO_2$ and metal oxide nanoparticles), fibers (such as metal oxides nano-fibers and carbon nanotubes) and platelets (clay) can be used for encapsulation, structure reinforcements or as fire retardants.

Step 3. Bottom Contact Deposition

A bottom contact is deposited on top of the substrate. The dimensions of the bottom contact typically range from a few $mm^2$ to $m^2$ and the thickness of the contact typically ranges from a few to several hundred nm. A semitransparent high work function metal (such as, but not limited to Au, Ag, Co, Ni, Pt, Pd or Mo), metal oxide (such as ITO) or organic conductor (such as, but not limited to carbon nanotube, graphene, polymers) can be deposited by evaporation, sputtering, or inkjet printing of metal nanoparticles followed by annealing.

Step 4. Carrier Layer Deposition

A carrier layer is deposited on top of the bottom contact. The dimensions of the carrier layer typically range from a few $mm^2$ to $m^2$ and the thickness of the contact typically ranges from a few to several hundred nm. For conventional organic solar cell architectures, a charge carrier layer (PEDOT:PSS) is deposited. For an inverted architecture, an electron carrier layer (zinc oxide nanoparticle or nanorods) is deposited. Deposition of the carrier layer is achieved by common polymer deposition techniques such as spin coating, spray coating, dip coating, doctor blading, inkjet printing, screen printing. An annealing step may be needed for improved carrier conduction.

Step 5. Active Polymer Layer Deposition

A photoactive polymer layer or tandem layers are deposited on top of the carrier layer. The dimensions of the carrier layer typically range from a few mm² to m² and the thickness of the contact can range from a few to several hundred nm. Potential active components for organic photovoltaic stacked tandem cells are the following: P3HT/PCBM blends (spectrum coverage 400-600 nm), $Cu_2S$ quantum dots/CdS nanorods (600-800 nm), and PbS or PbSe quantum dots (800-1200 nm, polymers that may be used are polythiophenes and other polymer conjugated systems with suitable bandgap, spectral and transport conditions such as P3HT or P3OT. The design of the present invention allows for the use of any appropriate material whose absorption spectrum matches that of the solar spectrum. The deposition of single photoactive polymer layer is achieved with commonly used polymer deposition techniques such as spin coating, spray coating, dip coating, doctor blading, inkjet printing, screen printing. The deposition of two or more photoactive polymer layers is achieved by inkjet printing and screen printing. An annealing step may be needed to form optimized bulk heterojunctions for improved solar cell efficiencies.

Step 6. Top Contact Deposition

A top contact is deposited on top of the active layer. The dimensions of the top contact typically range from a few mm² to m² and the thickness of the contact typically ranges from a few to several hundred nm. A low work function metal (such as, but not limited to Al, Ca or Mg), metal alloy or MgIn alloy is deposited by evaporation or sputtering. For reverse or inverted architecture, a high work function metal (such as, but not limited to Au, Ag, Co, Ni, Pt, Pd or Mo), metal oxide or organic conductor (such as, but not limited to carbon nanotube, graphene, polymers) is deposited by evaporation, sputtering, or inkjet printing of metal nanoparticles followed by annealing. An annealing step may be needed to form optimized polymer/contact interfaces for improved solar cell efficiencies.

Step 7. Repeat Steps 2-6

To fabricate the final OPV stacked cells (FIG. 16), repeat step 2 to 6 multiple times to reach the desired stacking size.

Dependence of Efficiency on Angle of Entry of Incident Light

In order to maximize absorption of light by the active layer, light must enter the device at a specific optimum angle ($\theta_0$), which is determined by the respective layer thicknesses. Light will be absorbed to a far greater extent using this 'trapping' geometry due to the maximized path length that the incident light has to travel through the active layer. This principle is applied to an array of stacked cells which are orientated so that normally incident light from the sun will actually enter the stacked array at the optimum angle.

Figure 17:
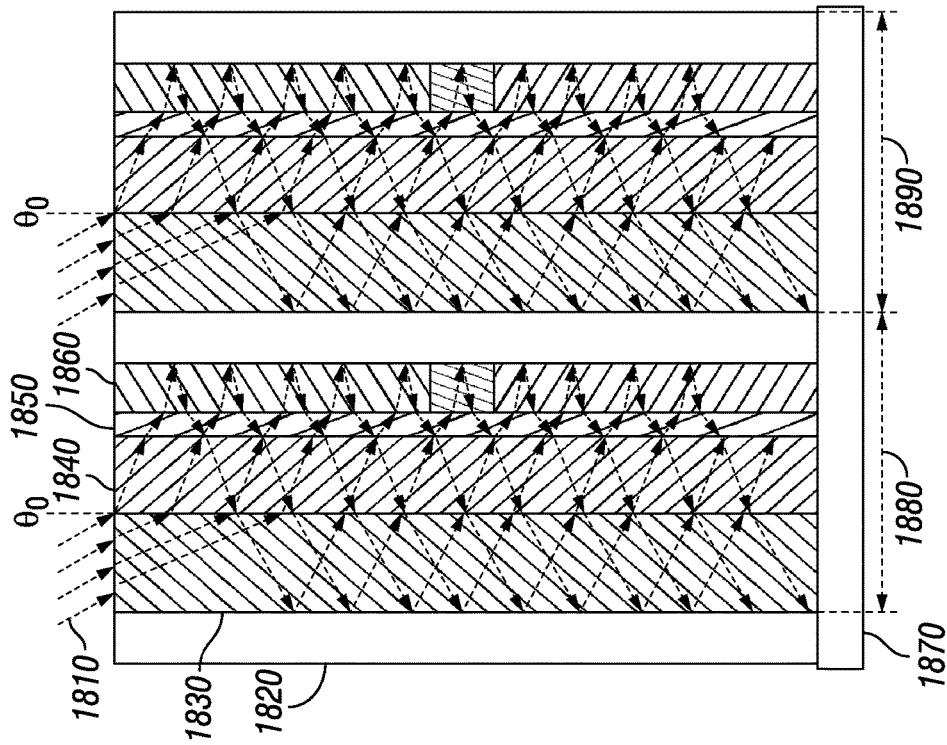
FIG. 17 is a simplified ray diagram illustrating light passing through stacked photovoltaic cells.

FIG. 17 is a simplified ray diagram, illustrating light passing through stacked photovoltaic cells, showing incident light 1710, incidence angle $\theta_0$, cathode 1720, substrate 1730, anode 1740, carrier layer 1750, photoactive layer 1760, mirrored surface 1770, 1st Stack Layer 1780, and 2nd Stack Layer 1790. Incident light 1710 may be sunlight. It illustrates the path that incident light travels through the device. Once the unabsorbed light reaches the bottom of each stack 1780 and 1790, it is incident upon a mirrored surface. It is then reflected back along each respective stack 1780 and 1790, to be further absorbed. On its second pass along each respective stack 1780 and 1790, it passes through active layer 1760 again multiple times. This light trapping process is forcing the incident light to travel through effectively a far 'thicker' photoactive layer than possible with conventional flat panel architectures. Such configuration addresses the loss of light inherent with the flat panel.

In order to convert more of the incident light energy, it is necessary as mentioned previously, to use more than one photoactive layer. A slight modification on the stack allows for the use of two (twin—as shown in FIG. 18), three (tri-) or even four (quad-) or more cell photoactive layer architectures.

Figure 18:
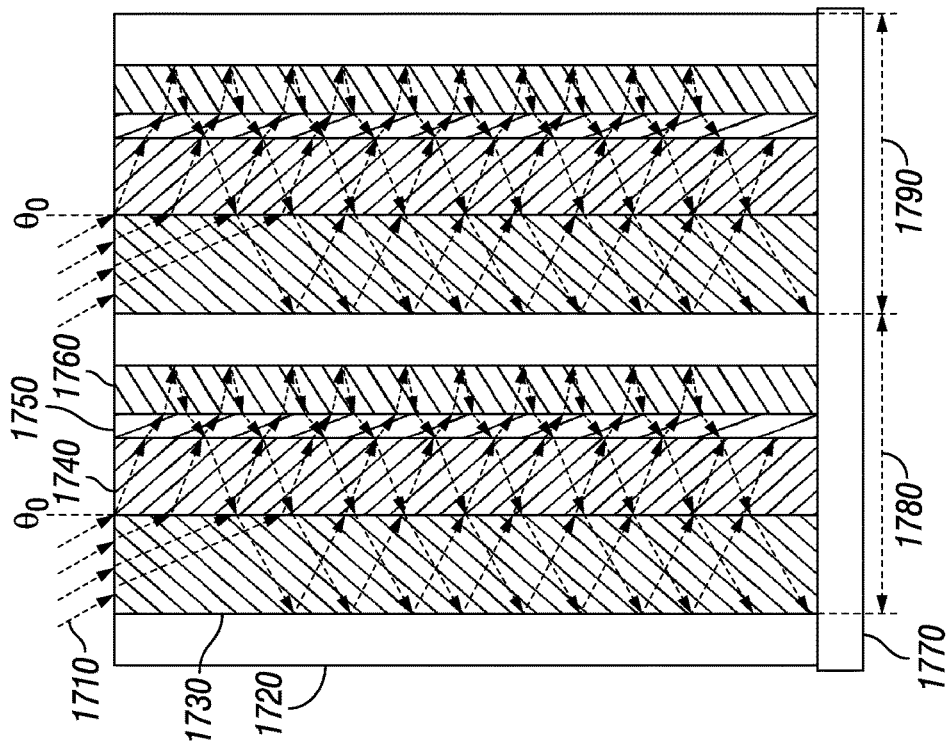
FIG. 18 is a simplified ray diagram illustrating light passing through stacked twin photovoltaic (PV) cells.

FIG. 18 is a simplified ray diagram illustrating light passing through stacked twin photovoltaic (PV) cells, showing incident light 1810, angle $\theta_0$, cathode 1820, substrate 1830, anode 1840, carrier layer 1850, twin photoactive layer 1860, mirrored Surface 1870, 1st stack layer 1880, and 2nd stack layer 1890. Twin photoactive layer 1060 contains a first photoactive layer, a spacer, and a second photoactive layer. Incident light 1810 may be sunlight. FIG. 18 illustrates the path that incident light travels through the 'twin'-active layer material device. Once the unabsorbed light reaches the bottom of each stack 1880 and 1890, it is incident upon minored surface 1870. It is then reflected back along each respective stack 1880 and 1890, to be further absorbed. On its second pass along each respective stack 1880 and 1890, it passes through the active layer 1860 again multiple times.

Stack Contacting

Figure 19A:
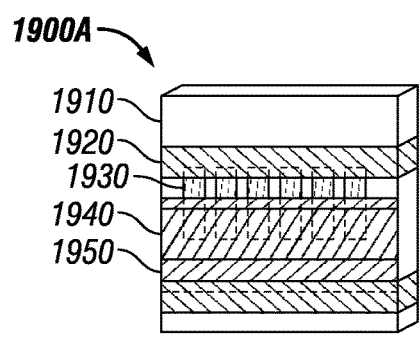
FIG. 19A illustrates metal strips deposited on a substrate with photovoltaic (PV) devices.

1. For Stacking of Photovoltaic Cells Made of Glass or Inflexible Substrate:

Two metal strips can be deposited a shown in FIG. 19A. FIG. 19A illustrates metal strips deposited on a substrate with photovoltaic (PV) devices, showing photovoltaic cell 1900A, glass 1910, metal strips 1920, cathodes (e.g. aluminium) 1930, photoactive layer 1940, anode (e.g. indium tin oxide) 1950. Metal strip 1020 connects cathodes 1930. The two metal strips make a parallel connection of the PV devices. One strip connects the cathodes (e.g. Al) of the PV devices. The other strip is deposited partly superimposing the anode (e.g. ITO). The deposition is also done on the sides of the substrate to extend the cathode and the anode.

Figure 19B:
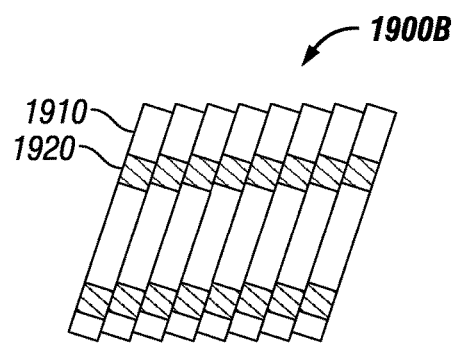
FIG. 19B shows a side view of stacked photovoltaic (PV) devices shown in FIG. 19A with deposited metal strips.

The substrate can then be stacked as shown in FIG. 19B. FIG. 19B shows a side view of stack 1900B of the photovoltaic (PV) cells of FIG. 19A, showing glass 1910 and metal strip 1920.

Figure 19C:
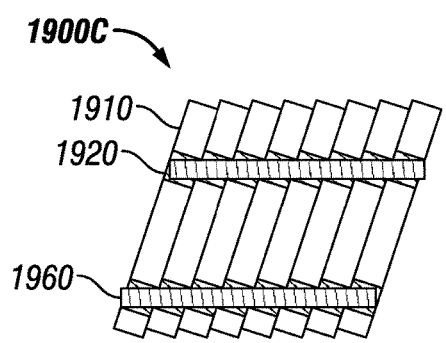
FIG. 19C illustrates conductive tapes applied on the exposed metal strips shown in FIG. 19B.

To connect the electrodes of all the glass slides, a conductive tape can be used in the manner as shown in FIG. 19C. FIG. 19C illustrates conductive tapes applied on the exposed metal strips shown in FIG. 19B, showing taped stack 1900C, glass 1910, metal strips 1920, and conductive tapes 1960.

The conductive tape can be: A metal tape stuck to the side of the stack using conductive epoxy. Alternatively, a conductive nanoparticle ink or metal paste, which upon heating gives a uniform layer can be used.

Figure 19D:
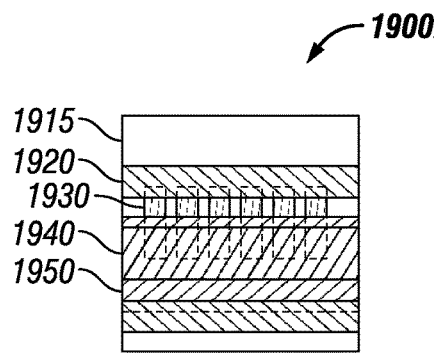
FIG. 19D illustrates metals strips deposited on a flexible substrate with photovoltaic (PV) devices.

2. For Stacking PV Cells Made of Flexible Substrates:

Two metal strips are deposited. One strip connects the cathodes of the pixel devices. The other is deposited covering the anode partly (FIG. 19D). FIG. 19D illustrates metals strips 1920 deposited on a flexible substrate 1915 with photovoltaic (PV) devices, showing photovoltaic cell 1900D, flexible substrate 1915, metal strips 1920, cathodes 1930, photoactive layer 1940, and anode 1950. The flexible substrate is bent at the side without damaging the metal strips (FIG. 19E).

Figure 19E:
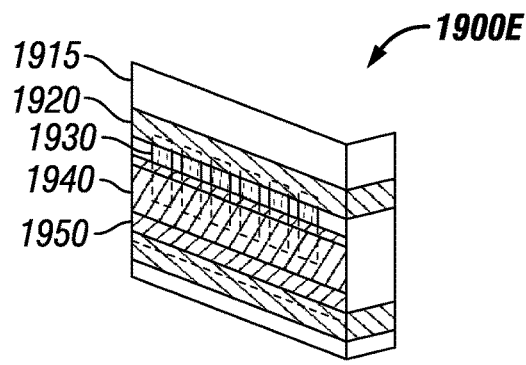
FIG. 19E illustrates bending of the flexible substrate shown in FIG. 19D without damaging the connections.

FIG. 19E illustrates bending of flexible substrate 1915 without damaging the connections, showing bent photovoltaic cell 1900E, flexible substrate 1915, metal strips 1920, cathodes 1930, photoactive layer 1940, and anode 1950.

Figure 19F:
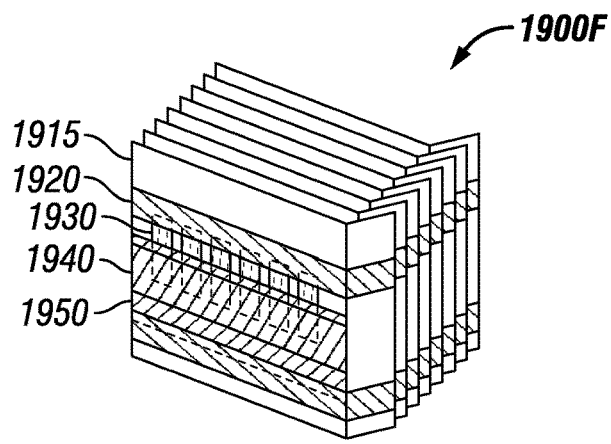
FIG. 19F illustrates stacking of the photovoltaic (PV) devices shown in FIG. 19E.

When such substrates are stacked on top of one another it will have a structure as shown in FIG. 19F. FIG. 19F illustrates stacking of the photovoltaic (PV) devices shown in FIG. 19E, showing stack 1900F, flexible substrate 1915, metal strips 1920, cathodes 1930, photoactive layer 1940, and anode 1950. A part of each of the metals strips connecting the cathode and anode of the pixel devices on each substrate is exposed.

Figure 19G:
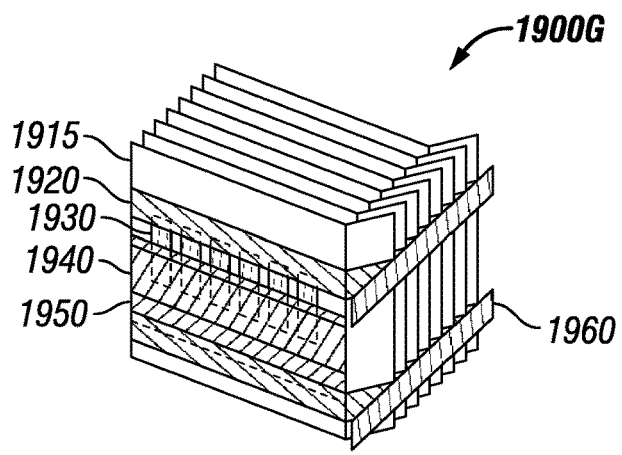
FIG. 19G illustrates conductive tapes applied on the exposed metal strips shown in FIG. 19F.

A conductive tape (which has been mentioned earlier) is used to connect the exposed part of the metal strips as shown in FIG. 19G. FIG. 19G illustrates conductive tapes 1960 applied on exposed metal strips 1920 shown in FIG. 19F, showing taped stack 1900G, flexible substrate 1915, metal strips 1920, cathodes 1930, photoactive layer 1940, and anode 1950.

Thermal Solar Cells

The device described herein also addresses a critical problem that is well-known of photovoltaic devices, which is the thermal degradation of the cell components due to temperature building caused by exposure to the sun. Over time, thermal degradation can become a big problem that affects the longevity of cells. The present invention addresses that issue by having thermal fluid inlets on the base substrate, as illustrated in FIGS. 2B, 3, 6, 8, 13, and 14, that collects and dissipates the heat away from the other cell components. This can also be achieved using the concentrator architecture where the light is channeled into the cells that contain thermal fluid channels (using a transparent fluid such as water) to absorb and hence reduce the thermal energy generation. The light concentration can be achieved by using fresnel lens, parabolic mirrors or derivatives of such structures (as shown in FIGS. 2B and 3). The contacting can be done in series or parallel, and examples of the contacting shown in FIGS. 19E, 19F, and 19G).

What is claimed is:

1. A photovoltaic device adapted for receiving incident light, comprising:
   a plurality of photovoltaic cells, wherein each of the plurality of photovoltaic cells comprises:
      a first conductive layer,
      a photoactive layer adjacent the first conductive layer, wherein the photoactive layer comprises an organic material,
      a second conductive layer adjacent the photoactive layer,
      a substrate adjacent to one of the first conductive layer or second conductive layer,
      a first planar interface is formed between the first conductive layer and the photoactive layer, and a second planar interface is formed between the photoactive layer and the second conductive layer;
   wherein each layer of the plurality of photovoltaic cells has an upper surface and a lower surface, the lower surface is opposite to the upper surface, and each layer of the plurality of photovoltaic cells are stacked parallel to each other in a stacking direction;
   wherein a first top end of the plurality of photovoltaic cells nearer the incident light for receiving the incident light is a first plane formed by the upper surface of each of the first conductive layer, the photoactive layer, the second conductive layer, and the substrate of the plurality of photovoltaic cells, and a second bottom end of the plurality of photovoltaic cells is a second plane formed by the lower surface of each of the first conductive layer, the photoactive layer, and the second conductive layer of the plurality of photovoltaic cells;
   wherein the first planar interface and the second planar interface of each of the plurality of photovoltaic cells are oriented perpendicular to both the first plane of the first top end and the second plane of the second bottom end of the plurality of photovoltaic cells;
   wherein the first top end of the plurality of photovoltaic cells is spaced apart and parallel to the second bottom end of the plurality of photovoltaic cells in a vertical direction perpendicular to the stacking direction;
   wherein a channel runs through the substrate and is oriented to extend perpendicular to both the stacking direction and the vertical direction; and
   a reflective surface in contact with the second bottom end of the plurality of photovoltaic cells.

2. The photovoltaic device according to claim 1, wherein one or more of the first conductive layer and second conductive layer comprises a material selected from among transparent and semi-transparent materials.

3. The photovoltaic device according to claim 1, wherein the photoactive layer comprises a thin film.

4. The photovoltaic device according to claim 1, wherein each of the plurality of photovoltaic cells further comprises a fully-reflective layer or semi-reflective layer.

5. The photovoltaic device according to claim 1 further comprising a lensing system disposed between the incident light and the first top end of the plurality of photovoltaic cells.

\* \* \* \* \*